United States Patent
Okada et al.

(10) Patent No.: US 10,436,833 B2
(45) Date of Patent: Oct. 8, 2019

(54) EVALUATION APPARATUS AND EVALUATION METHOD

(71) Applicant: Mitsubishi Electric Corporation, Tokyo (JP)

(72) Inventors: Akira Okada, Tokyo (JP); Kinya Yamashita, Tokyo (JP); Masaki Ueno, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 54 days.

(21) Appl. No.: 15/676,393

(22) Filed: Aug. 14, 2017

(65) Prior Publication Data

US 2018/0180660 A1 Jun. 28, 2018

(30) Foreign Application Priority Data

Dec. 27, 2016 (JP) .................................. 2016-252440

(51) Int. Cl.
*G01R 31/26* (2014.01)
*G01R 1/073* (2006.01)
*G05B 15/02* (2006.01)

(52) U.S. Cl.
CPC ......... *G01R 31/2608* (2013.01); *G01R 1/073* (2013.01); *G05B 15/02* (2013.01)

(58) Field of Classification Search
CPC ....... G01R 1/73; G01R 31/2608; G05B 15/02
See application file for complete search history.

(56) References Cited

U.S. PATENT DOCUMENTS

| | | | |
|---|---|---|---|
| 5,806,138 A * | 9/1998 | Kawasaki | B08B 5/02 15/303 |
| 8,610,446 B2 | 12/2013 | Yoshida et al. | |
| 9,562,942 B2 | 2/2017 | Shinohara et al. | |
| 2012/0299613 A1 | 11/2012 | Kaguchi et al. | |
| 2014/0202635 A1 * | 7/2014 | Yamaguchi | H01J 37/32733 156/345.51 |

(Continued)

FOREIGN PATENT DOCUMENTS

| | | |
|---|---|---|
| JP | S60-116243 U | 8/1985 |
| JP | S60-239036 A | 11/1985 |

(Continued)

OTHER PUBLICATIONS

An Office Action; "Notice of Reasons for Refusal," issued by the Japanese Patent Office dated Aug. 20, 2019, which corresponds to Japanese Patent Application No. 2016-252440 and is related to U.S. Appl. No. 15/676,393; with English language translation.

*Primary Examiner* — Tung X Nguyen
*Assistant Examiner* — Dominic E Hawkins
(74) *Attorney, Agent, or Firm* — Studebaker & Brackett PC

(57) ABSTRACT

Provided is a technique capable of preventing occurrence of partial discharge. An evaluation apparatus includes a probe disposed on an undersurface of an upper component; a sidewall part disposed on the undersurface of the upper component and enclosing sides of the probe; and a first gas supplying part. The first gas supplying part is capable of supplying a gas to a to-be-measured object that is placed on a stage when the sidewall part comes in proximity to the stage, and to a space enclosed by the stage, the sidewall part, and the upper component when the sidewall part is in contact with the stage.

20 Claims, 10 Drawing Sheets

(56) References Cited

U.S. PATENT DOCUMENTS

| | | | |
|---|---|---|---|
| 2014/0210500 A1 | 7/2014 | Akiyama et al. | |
| 2015/0015285 A1* | 1/2015 | Shinohara | G01R 1/0491 |
| | | | 324/750.19 |
| 2015/0115989 A1* | 4/2015 | Okada | G01R 31/2808 |
| | | | 324/754.03 |
| 2015/0132967 A1* | 5/2015 | Urakawa | H01L 21/67109 |
| | | | 438/714 |
| 2016/0198528 A1* | 7/2016 | Kitagawa | H05B 3/283 |
| | | | 156/345.52 |
| 2017/0011923 A1* | 1/2017 | Tanimura | H05B 3/0047 |
| 2018/0088169 A1* | 3/2018 | Noguchi | G01K 1/14 |

FOREIGN PATENT DOCUMENTS

| | | |
|---|---|---|
| JP | S64-000742 A | 1/1989 |
| JP | H03-292748 A | 12/1991 |
| JP | 2011-252792 A | 12/2011 |
| JP | 2012-247196 A | 12/2012 |
| JP | 2014-089105 A | 5/2014 |
| JP | 2014-145615 A | 8/2014 |
| JP | 2015-035577 A | 2/2015 |
| JP | 2015-087269 A | 5/2015 |

\* cited by examiner

F I G. 1
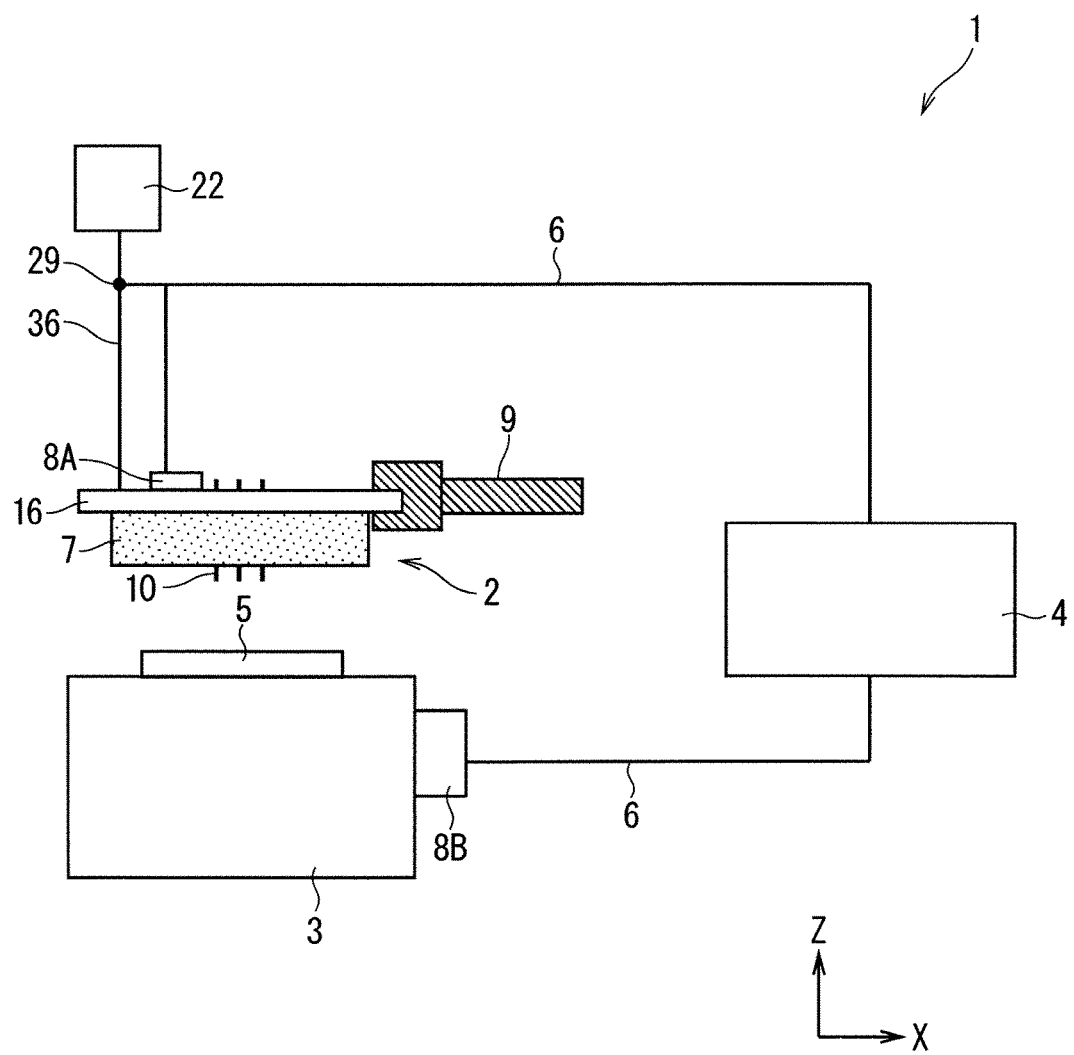

F I G. 5
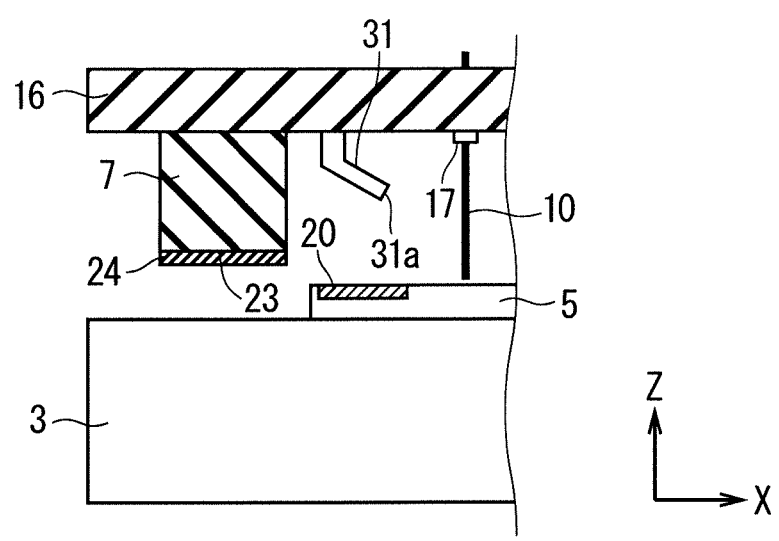

F I G. 9
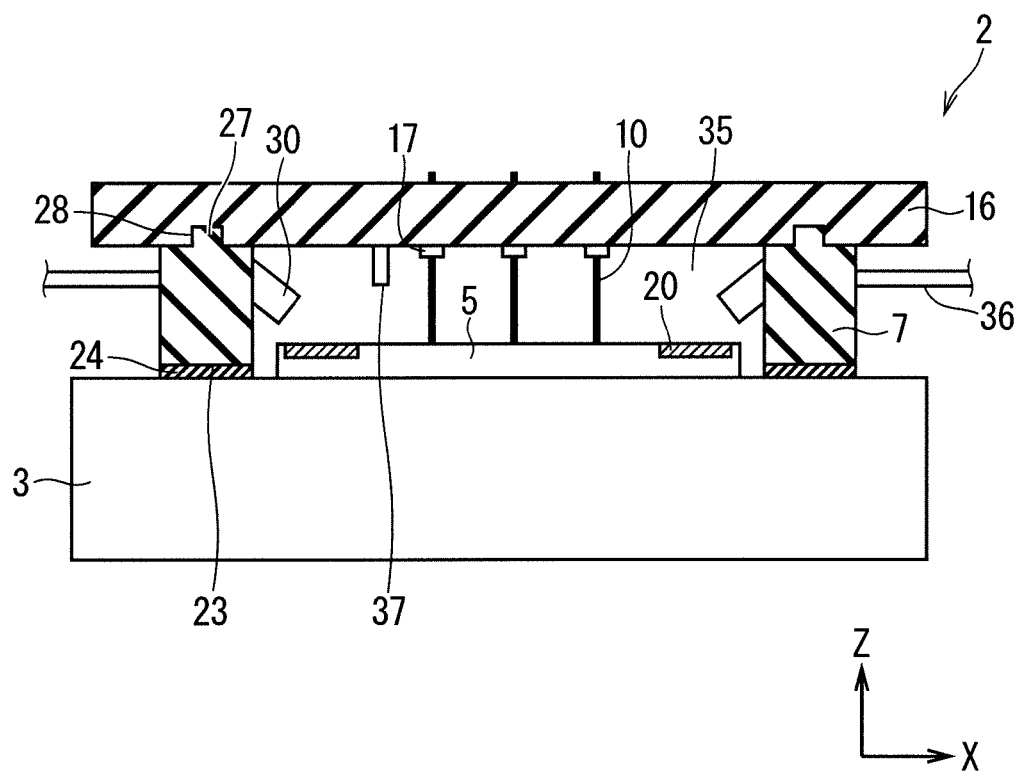

EVALUATION APPARATUS AND EVALUATION METHOD

BACKGROUND OF THE INVENTION

Field of the Invention

The present invention relates to an evaluation apparatus that evaluates electrical characteristics of an object subject to measurement that is a to-be-measured object, and to an evaluation method.

Description of the Background Art

Evaluation apparatuses that evaluate electrical characteristics of a to-be-measured object, such as a semiconductor device that is a semiconductor wafer or semiconductor chips diced from the semiconductor wafer have been known. When evaluating the electrical characteristics, the evaluation apparatuses bring, for example, by vacuum suction, an installation surface of the to-be-measured object in contact with a placed surface of a chuck stage to fix the installation surface, and then bring a probe that transmits and receives electrical signals in contact with an electrode disposed on a part of a non-installation surface of the to-be-measured object. When the to-be-measured object is a semiconductor device with a vertical structure which applies a high current in a vertical direction, that is, in an off-plane direction, a chuck stage equipped with an electrode on its placed surface is used. In such evaluation apparatuses, the number of pins has long been increased to meet the demand for application of a high current and a high voltage.

When the to-be-measured object is a semiconductor device with the vertical structure that is formed into a chip, a potential difference between an electrode disposed on a part of a non-installation surface of the semiconductor device and an area closer to the chuck stage that has the same potential as that of the chuck stage may cause a partial discharge phenomenon during the evaluation. This partial discharge causes a partial breakage or a malfunction in the semiconductor device. The partial discharge may occur between probes having a potential difference or between a probe and another electrode having a potential difference with the probe.

If a semiconductor device in which the partial discharge has occurred is sent to subsequent processes as a conforming item as it is, it is very difficult to screen out such a semiconductor device in the subsequent processes. Thus, it is desirable to take a measure against a malfunction caused by the partial discharge through prevention of the partial discharge. Accordingly, various techniques for preventing the partial discharge have been proposed (for example, Japanese Patent Application Laid-Open No. 2011-252792 (hereinafter referred to as Patent Document 1) and Japanese Patent Application Laid-Open No. 2015-35577 (hereinafter referred to as Patent Document 2)).

Under the technique disclosed by Patent Document 1, a to-be-measured object is placed in a sealed pressure vessel and is evaluated with application of pressure to the pressure vessel to prevent the discharge occurring while the to-be-measured object is being tested with a high voltage. Under the technique disclosed by Patent Document 2, a device in a wafer is inspected with application of pressure to a component in a non-sealing state without using a sealed pressure vessel to prevent the discharge.

However, since a foreign substance present on the to-be-measured object in the evaluation may create a discharge path through the foreign substance under the techniques of both Patent Documents 1 and 2, the likelihood of a discharge preventing effect may be slim.

SUMMARY

The present invention has been conceived in view of the problems above, and is intended to provide a technique capable of preventing occurrence of the partial discharge.

An aspect of the present invention is an evaluation apparatus that evaluates electrical characteristics of an object subject to measurement that is a to-be-measured object and includes: a stage on which the to-be-measured object is placed; and an upper component disposed above the stage. The stage and the upper component can come in proximity to and be separated from each other. The evaluation apparatus further includes: a probe disposed on an undersurface of the upper component; a sidewall part disposed on the undersurface of the upper component and enclosing sides of the probe; a first gas supplying part capable of supplying a gas to the to-be-measured object placed on the stage when the sidewall part comes in proximity to the stage, and to a space when the sidewall part is in contact with the stage, the space being enclosed by the stage, the sidewall part, and the upper component; and an evaluator that evaluates the electrical characteristics of the to-be-measured object connected to the probe, with a pressure increased in the space through supplying the gas from the first gas supplying part.

Consequently, the occurrence of the partial discharge can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic side view illustrating a structure of an evaluation apparatus according to Preferred Embodiment 1;

FIG. 5 is a schematic cross view illustrating a part of the structure of the evaluation apparatus according to Preferred Embodiment 1;

FIG. 9 is a schematic cross view illustrating a part of a structure of an evaluation apparatus according to Modification 1;

DESCRIPTION OF THE PREFERRED EMBODIMENTS

[Preferred Embodiment 1]

FIG. 1 is a schematic side view illustrating a structure of an evaluation apparatus 1 according to Preferred Embodiment 1 of the present invention. The evaluation apparatus 1 in FIG. 1 is an apparatus that evaluates electrical characteristics of an object subject to measurement that is a to-be-measured object. Although the to-be-measured object herein is a semiconductor device 5 such as a chip, it may be, for example but not limited to, a semiconductor wafer. Before describing the evaluation apparatus 1, the semiconductor device 5 that is the to-be-measured object will be described.

Figure 2:
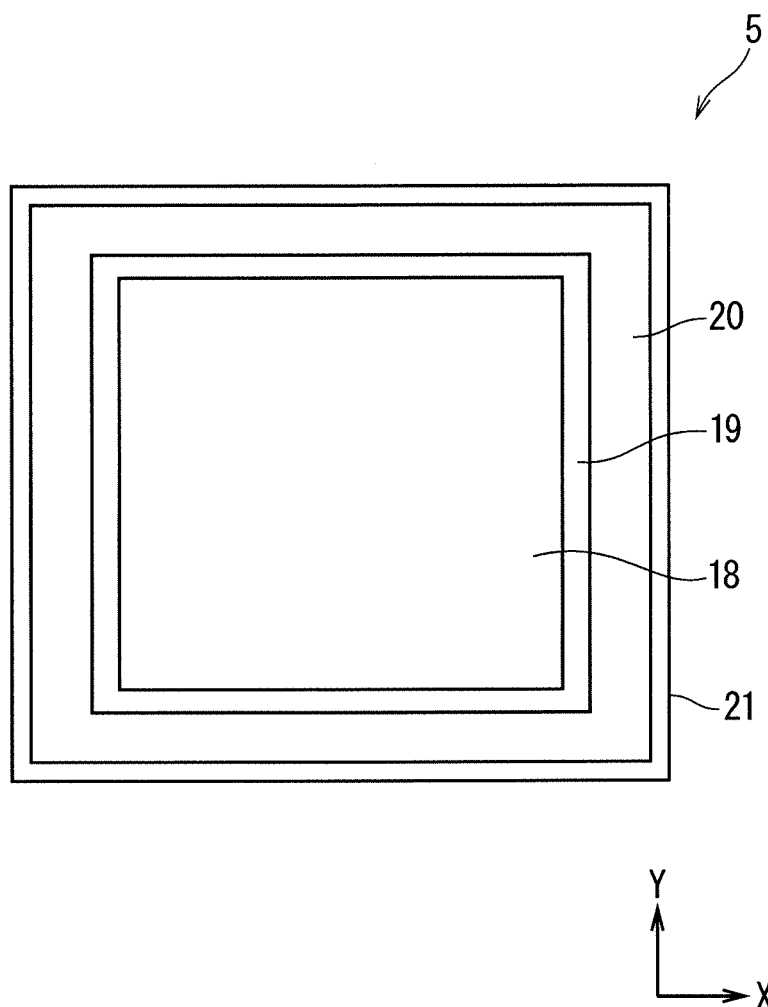
FIG. 2 is a schematic plan view illustrating an example structure of a semiconductor device.

FIG. 2 is a schematic plan view illustrating an example structure of the semiconductor device 5. The semiconductor device 5 according to Preferred Embodiment 1 is, but not limited to, an insulated gate bipolar transistor (IGBT) with a vertical structure which applies a high current in a vertical direction, that is, in an off-plane direction. In a plan view, the semiconductor device 5 includes an active area 19 and an edge termination area 20. The edge termination area 20 is disposed inside a dicing line of the single semiconductor device 5 and along a periphery 21 so as to be able to withstand a breakdown voltage. In the active area 19 disposed inside the edge termination area 20, desired elements including a vertical IGBT are arranged.

Electrode pads 18 that are connection pads that transmit and receive electrical signals to and from an external device are placed on both sides of the active area 19. The electrode pads 18 are made of, for example, aluminum having electrical conductivity. In the vertical IGBT, the electrode pad 18 on the front side is disposed as an emitter electrode and a gate electrode, and the electrode pad 18 on the back side is disposed as a collector electrode. The positions and the number of the electrodes of the semiconductor device 5 are not limited to these.

The evaluation apparatus 1 in FIG. 1 includes a probe base 2, a chuck stage 3 that is a stage on which the semiconductor device 5 is placed, an evaluation controller 4 that is an evaluator and a controller, and a movable arm 9.

The probe base 2 includes a mounting plate 16 that is an upper component disposed above the chuck stage 3.

The movable arm 9 can move the probe base 2 and further the mounting plate 16 in a given direction. Accordingly, the chuck stage 3 and the mounting plate 16 can come in proximity to or be separated from each other by the movable arm 9. The probe base 2 may be stably held not by the single movable arm 9 but by a plurality of movable arms 9. Furthermore, not the probe base 2 but the semiconductor device 5, that is, the chuck stage 3 side may be moved.

Figure 3:
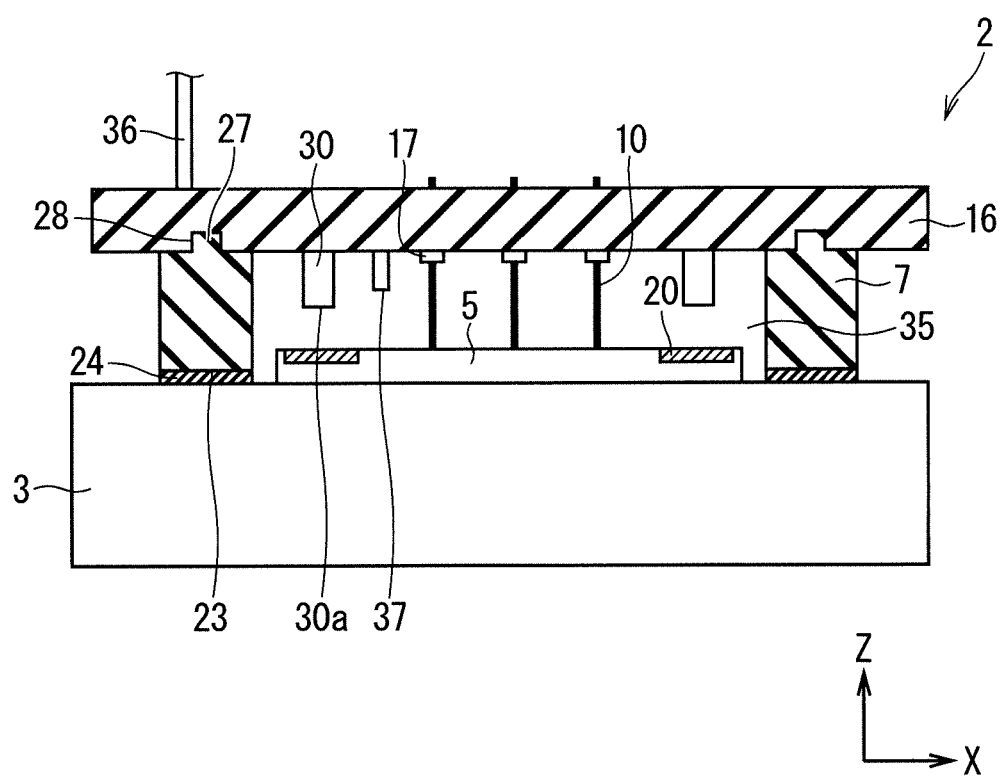
FIG. 3 is a schematic cross view illustrating a part of the structure of the evaluation apparatus 1 according to Preferred Embodiment 1.
Figure 4:
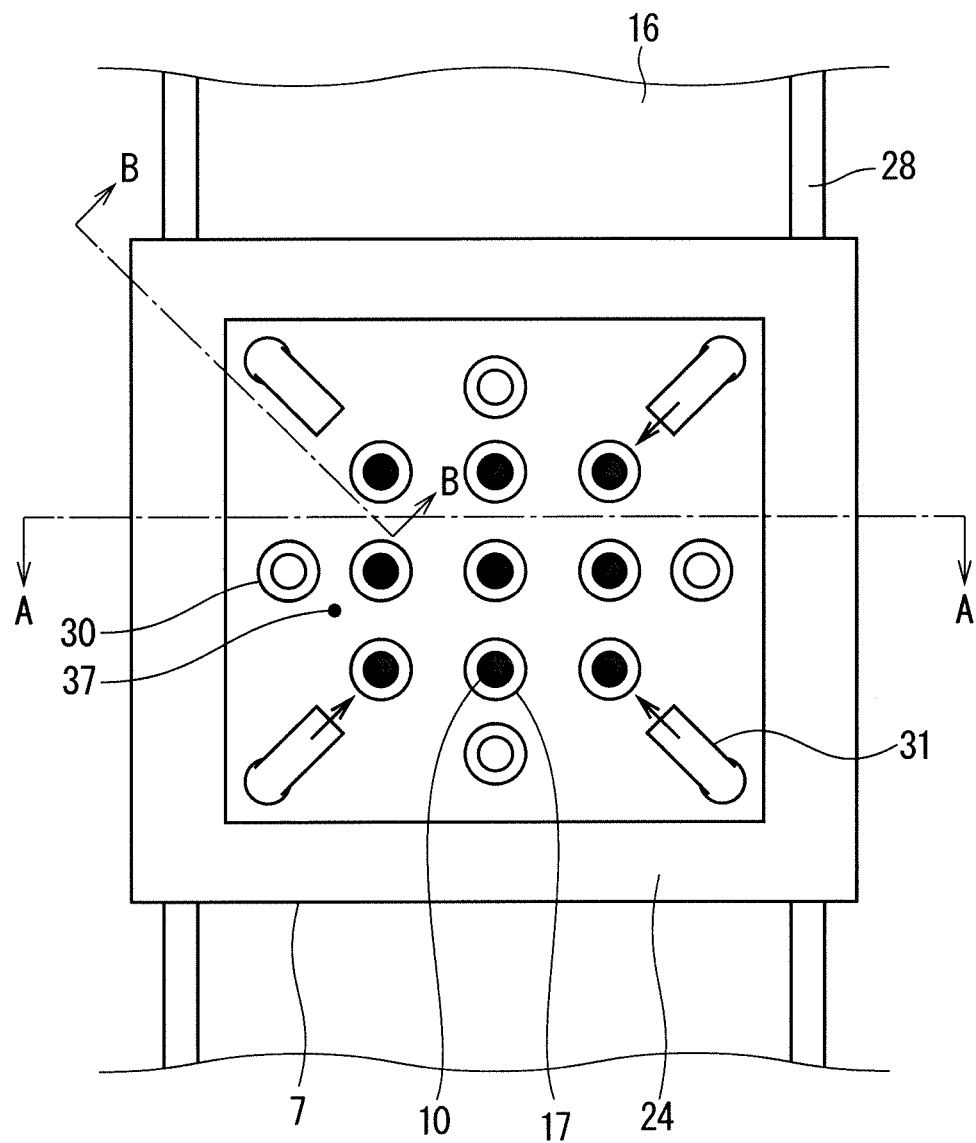
FIG. 4 is a schematic plan view illustrating a part of the structure of the evaluation apparatus according to Preferred Embodiment 1.

FIG. 3 is a schematic cross view illustrating a part of the structure of the evaluation apparatus 1 according to Preferred Embodiment 1, specifically, a part of a structure including the probe base 2 and the chuck stage 3. FIG. 4 is a schematic plan view illustrating the part of the structure when seen from the lower side of the mounting plate 16.

FIG. 5 is a schematic cross view illustrating the part of the structure when seen from another cross section. FIG. 3 is a schematic cross view taken along A-A of FIG. 4, and FIG. 5 is a schematic cross view taken along B-B of FIG. 4.

As illustrated in FIG. 3, the evaluation apparatus 1 includes probes 10 disposed on the undersurface of the mounting plate 16. The probe 10 is one electrode to be connected to an external device, and is in contact with the electrode pad 18 (FIG. 2) disposed on the upper surface of the semiconductor device 5 when the semiconductor device 5 with the vertical structure is evaluated. The front side of the chuck stage 3 is another electrode to be connected to an external device, and is in contact with an installation surface that is an undersurface of the semiconductor device 5 when the semiconductor device 5 with the vertical structure is evaluated.

Although FIG. 1 illustrates the partial view, the probes 10 are electrically connected to the evaluation controller 4 through the mounting plate 16, a connector 8A disposed on the mounting plate 16, and a signal line 6 connected to the connector 8A. The front side of the chuck stage 3 is electrically connected to the evaluation controller 4 through the inner portion of the chuck stage 3, a connector 8B disposed on the side surface of the chuck stage 3, and the signal line 6 connected to the connector 8B. Thus, when the semiconductor device 5 is evaluated, the evaluation controller 4 is electrically connected to the front side and the back side of the semiconductor device 5. The "electrically connected" herein means a connection allowing a current to flow in both directions with application of a voltage normally used.

A plurality of the probes 10 are provided on the assumption that a current, for example, higher than or equal to 5 A is applied. A distance between the connector 8A that connects the signal line 6 to the mounting plate 16 and the connector 8B disposed on the side surface of the chuck stage 3 is preferably approximately the same through any of the probes 10. In such a structure, the current density to be applied to each of the probes 10 can be approximately the same. Particularly, the connector 8A preferably faces the connector 8B through the probes 10.

Next, the chuck stage 3 will be described in detail. The chuck stage 3 is a base for fixing one or more semiconductor devices 5 while being in contact with the installation surfaces thereof. According to Preferred Embodiment 1, vacuum suction is used as a means for fixing the semiconductor device 5, that is, a means for holding the semiconductor device 5. The means for holding the semiconductor device 5 is not limited to the vacuum suction but may be, for example, electrostatic adsorption. In order to simplify the description, not limited to but an example in which the single semiconductor device 5 is placed on the chuck stage 3 will be described hereinafter.

Next, the constituent elements ranging from the probes 10 to the evaluation controller 4 will be described in detail.

Figures 6A, 6B, 6C:
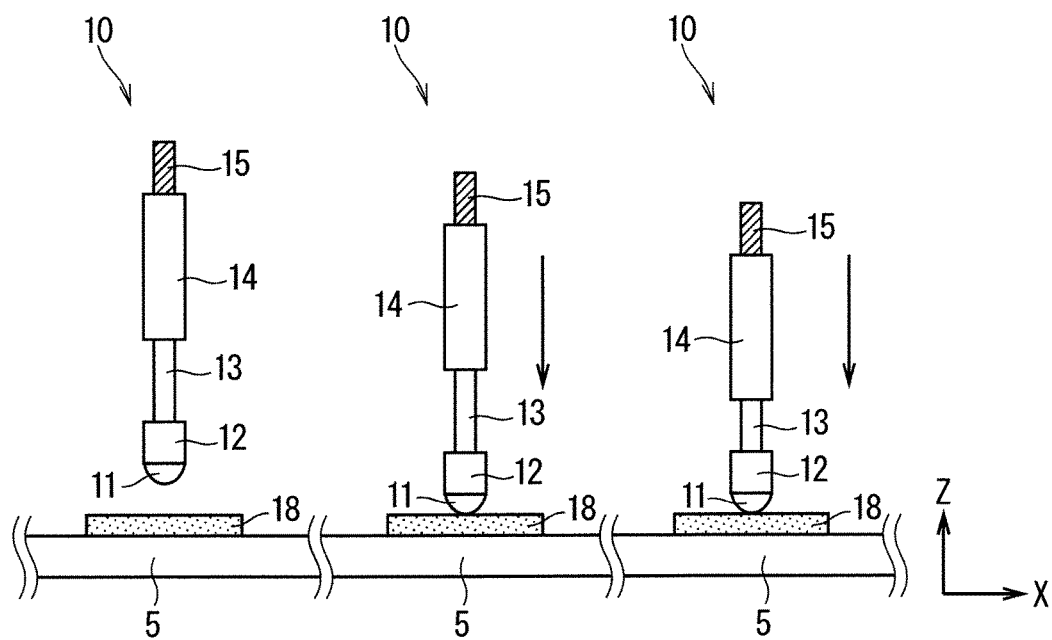
FIGS. 6A to 6C are side views each illustrating a part of the structure of the evaluation apparatus according to Preferred Embodiment 1.

FIGS. 6A to 6C are side views each illustrating the probe 10 of the evaluation apparatus 1 according to Preferred Embodiment 1. The probe 10 includes a tip part 12 including a contact part 11, and includes a pressing part 13, a base placing part 14, and an electrical connector 15.

The contact part 11 is mechanically and electrically in contact with the electrode pad 18 disposed on the front side of the semiconductor device 5. The pressing part 13 is mechanically and electrically connected to the tip part 12 including the contact part 11, and can slide via a spring-loaded part such as a spring that is incorporated inside and is not illustrated, during the contact of the contact part 11.

The base placing part 14 that is a base is held on the mounting plate 16 through a socket 17 (FIGS. 3 and 4). The electrical connector 15 that is an external output terminal is electrically connected to the tip part 12 through the pressing part 13.

The probe 10 contains, but not limited to, a metal having electrical conductivity, for example, copper, tungsten, and rhenium tungsten. Particularly, the contact part 11 may be covered with another material, for example, gold, palladium, tantalum, and platinum to increase the conductivity and durability.

Operations of the probe 10 will be simply described hereinafter. When the probe 10 moves downward in a z-axis direction, that is, toward the electrode pad 18 disposed on the semiconductor device 5 from an initial state (FIG. 6A), the electrode pad 18 is in contact with the contact part 11 (FIG. 6B). After the probe 10 further moves downward, the pressing part 13 is pressed into the base placing part 14 while the spring-loaded part inside the base placing part 14 that is not illustrated is being elastically deformed (FIG. 6C). With such a structure, the probe 10 can be reliably in contact with the electrode pad 18 of the semiconductor device 5.

Although the probe 10 includes the spring-loaded part that is slidable in the z-axis direction and is not illustrated herein, the probe 10 is not limited to such but may be a probe including a spring-loaded part placed outside. Furthermore, the probe 10 is not limited to a spring-loaded contact probe but may be a cantilever contact probe. As long as the probe 10 is slidable in the z-axis direction, it is not limited to a spring-loaded contact probe but may be, for example, a multi-layered probe and a wire probe.

The probe 10 is held on the mounting plate 16 through the socket 17 illustrated in FIGS. 3 and 4. Since such a structure allows the probe 10 to be easily detached from the mounting plate 16, it is possible to facilitate, for example, changing the number of the probes 10 according to the size of the semiconductor device 5 and replacing the probe 10 in the event of breakage.

Next, the mounting plate 16 will be described. Each of the probes 10 is connected to the connector 8A through, for example, a line such as a metal plate that is disposed on the mounting plate 16 and is not illustrated. When a conductive line is directly disposed on the mounting plate 16 to be connected to the probes 10, the mounting plate 16 is preferably insulated. When, for example, an insulation covered cable is used as a line, the mounting plate 16 does not have to be insulated but may be made of, for example, a metal, that is, may have conductivity.

The probe base 2 of the evaluation apparatus 1 includes the mounting plate 16, the probes 10, the connector 8A, the sockets 17, and a line that is not illustrated and connects the connector 8A to the probes 10. In addition to these, the probe base 2 of the evaluation apparatus 1 further includes a sidewall part 7, first gas supplying parts 30, second gas supplying parts 31, and a temperature sensor 37 that is a temperature measuring part as illustrated in FIGS. 3 and 4.

The sidewall part 7 is disposed on the undersurface of the mounting plate 16 and encloses sides of the probes 10. As illustrated in FIG. 3, the sidewall part 7 is in contact with the chuck stage 3 when the semiconductor device 5 is evaluated. Here, the sidewall part 7 encloses and seals the semiconductor device 5 and a measurement space 35 that is a space surrounding the semiconductor device 5, in cooperation with the chuck stage 3 and the mounting plate 16.

The sidewall part 7 is made of an insulating material, for example, a resin such as polyphenylene sulfide (PPS) and a silicone rubber. Accordingly, the discharge during evaluation can be prevented. Since the semiconductor device 5 may be evaluated, for example, under a circumstance at a high temperature around 200° C. through increase in temperature of the chuck stage 3, the material of the sidewall part 7 is not limited to these but is preferably made of a material endurable to such a temperature. Reduction in cost can be expected when a plurality of sidewall parts 7 having the same shape are produced through a molding process.

As illustrated in FIG. 3, fitting parts 27 that are protrusions are disposed on a portion of the sidewall part 7 that is opposite to the chuck stage 3, that is, an upper portion of the sidewall part 7 according to Preferred Embodiment 1. The fitting parts 27 for this sidewall part 7 fits into groove parts 28 disposed in the undersurface of the mounting plate 16, so that the sidewall part 7 is fixedly disposed on the undersurface of the mounting plate 16. Assuming that the contour of the semiconductor device 5 (FIG. 2) to be evaluated is square, the sidewall part 7 is a rectangle (FIG. 4) allowing the semiconductor device 5 to be enclosed. However, the shape of the sidewall part 7 in a plan view is not limited to such. Although FIGS. 3 and 4 illustrates only a plurality of the groove parts 28 extending in Y direction for simplification, groove parts extending in X direction may be disposed in the mounting plate 16.

The structure in which the sidewall part 7 fits into the groove parts 28 disposed in the undersurface of the mounting plate 16 and is disposed on the undersurface of the mounting plate 16 is described above. The structure of fixedly disposing the sidewall part 7 on the undersurface of the mounting plate 16 is not limited to such but may be the one in which the fitting parts 27 of the sidewall part 7 fit into through holes (that is not illustrated) penetrating the undersurface of the mounting plate 16. The structure of fitting the fitting parts 27 into the through holes allows the sidewall part 7 to be easily detached from the mounting plate 16 when the sidewall part 7 is removed, because the sidewall part 7 can be pushed through openings of the through holes that are opposite to the sidewall part 7.

Furthermore, it is preferred in such a structure to dispose a plurality of through holes in the mounting plate 16 and to dispose, in the upper portion of the sidewall part 7, a plurality of fitting parts 27 that fit into the through holes. Since the size of each of the through holes can be made relatively smaller, an area of the upper surface of the mounting plate 16 which has no through hole and will be used for, for example, placing lines can be enlarged.

As illustrated in FIGS. 3 and 5, when the probe base 2 comes in proximity to the chuck stage 3, an end portion of the sidewall part 7 that is opposite to the fitting part 27, that is, the lower portion of the sidewall part 7 is in contact with the chuck stage 3. The lower portion of the sidewall part 7 has a flat surface 23 to be in contact with the surface of the chuck stage 3.

According to Preferred Embodiment 1, the flat surface 23 in the sidewall part 7 that can be in contact with the chuck stage 3 includes a flexible protective material 24. The protective material 24 is, for example, an elastic body. Such a structure can increase the durability of the lower portion of the sidewall part 7 that is subject to repeated contact, and improve contact properties and adhesion properties between the sidewall part 7 and the chuck stage 3. The protective material 24 is made of, for example, a rubber if the sidewall part 7 is made of a resin. The protective material 24 is made of a coating material such as Teflon coating ("Teflon" is a registered trademark) if the sidewall part 7 is made of a rubber. However, the materials of the sidewall part 7 and the protective material 24 are not limited to these.

Figure 7:
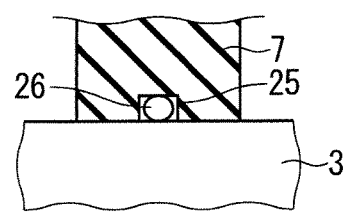
FIG. 7 is a schematic cross view illustrating a part of the structure of the evaluation apparatus according to Preferred Embodiment 1.

As illustrated in FIG. 7, the sidewall part 7 may have a depressed portion 25 approximately at the central plane of the flat surface 23, and a sealing part 26 such as an O-ring that is an elastic body may be disposed in the depressed portion 25 as an alternative to the above structure. In this structure, the sidewall part 7 is in contact with the chuck stage 3 through the sealing part 26. When the protective material 24 is deteriorated in the structure illustrated in FIGS. 3 and 5, it is somewhat difficult to replace only the protective material 24. In contrast, since replacing only the sealing part 26 such as an O-ring is relatively easier in the structure illustrated in FIG. 7, the replacing operations can be facilitated. Although the sealing part 26 is disposed in the flat surface 23 of the sidewall part 7 in the structure illustrated in FIG. 7, it is not limited to such but may be placed in the chuck stage 3.

As illustrated in FIGS. 3 and 4, in a portion enclosed by the sidewall part 7 and included in the undersurface of the mounting plate 16, the temperature sensor 37 is disposed. This temperature sensor 37 measures a temperature of the semiconductor device 5 placed on the chuck stage 3. The temperature sensor 37 monitors the temperature of the semiconductor device 5 through measurement whenever necessary according to Preferred Embodiment 1. Accordingly, the temperature of the semiconductor device 5 can be accurately measured during the evaluation of the semiconductor device 5 that is accompanied by fluctuations in the temperature, and thus the measurement accuracy can be increased.

When a gas is sprayed, i.e., the gas is jetted which will be described later, the temperature of the semiconductor device 5 may fluctuate from a desired temperature for evaluation, depending on a temperature of the sprayed gas. Thus, during the evaluation of electrical characteristics of the semiconductor device 5, it is preferred to monitor the temperature of the semiconductor device 5 using the temperature sensor 37. It is preferred to spray a gas whose temperature is adjusted as high as the temperature for evaluation to prevent fluctuations in the temperature of the semiconductor device 5 subject to the spraying of gas.

A radiation thermometer that can measure the temperature of the semiconductor device 5 even when not in contact with the semiconductor device 5 is used as the temperature sensor 37 according to Preferred Embodiment 1. It is expected that such a structure can facilitate the maintenance and reduce the breakage of the semiconductor device 5.

The temperature sensor 37 is not limited to the radiation thermometer. For example, a thermocouple or a thermistor either of which is not illustrated may be disposed as the temperature sensor 37 together with or instead of the probes 10. Accordingly, the temperature of the semiconductor device 5 may be monitored by bringing the thermocouple or the thermistor in contact with the semiconductor device 5 when evaluated. Since the thermocouple or the thermistor is in contact with the semiconductor device 5 in a structure using these, the temperature of the semiconductor device 5 can be accurately measured irrespective of a state of the surface of the semiconductor device 5. Although the single temperature sensor 37 is disposed herein, for example, a plurality of temperature sensors 37 may measure temperatures of a plurality of portions of the semiconductor device 5 to increase the measurement accuracy.

The first gas supplying parts 30 illustrated in FIGS. 3 and 4 can supply gas toward the semiconductor device 5 placed on the chuck stage 3 when the sidewall part 7 comes in proximity to the chuck stage 3. Accordingly, the first gas supplying parts 30 can spray the gas to the semiconductor device 5 before the sidewall part 7 is in contact with the chuck stage 3. Consequently, a foreign substance adhered to the semiconductor device 5 can be blown off and removed before the semiconductor device 5 is evaluated. Discharge easily occurs, particularly when the semiconductor device 5 is evaluated with a foreign substance present on the edge termination area 20 of the semiconductor device 5. Thus, removing the foreign substance on the edge termination area 20 before the evaluation is effective as described above.

As illustrated in FIGS. 3 and 4, in a portion enclosed by the sidewall part 7 and included in the undersurface of the mounting plate 16, four of the first gas supplying parts 30 are disposed according to Preferred Embodiment 1. Then, respective gas ports 30a (FIG. 3) of the first gas supplying parts 30 are directed in a vertical direction with respect to the upper surface of the chuck stage 3, specifically, the upper surface of the semiconductor device 5. Thus, the first gas supplying parts 30 can relatively intensely spray the gas to the semiconductor device 5.

When the sidewall part 7 is in contact with the chuck stage 3, the first gas supplying parts 30 can supply the gas to the measurement space 35 (FIG. 3) enclosed by the chuck stage 3, the sidewall part 7, and the mounting plate 16.

The second gas supplying parts 31 can supply gas toward the probes 10 when the sidewall part 7 comes in proximity to the chuck stage 3. Accordingly, the second gas supplying parts 31 can spray the gas to the probes 10 before the sidewall part 7 is in contact with the chuck stage 3. Consequently, a foreign substance adhered to the probes 10 can be blown off and removed before the semiconductor device 5 is evaluated.

As illustrated in FIGS. 4 and 5, in the portion enclosed by the sidewall part 7 and included in the undersurface of the mounting plate 16, four of the second gas supplying parts 31 are disposed according to Preferred Embodiment 1. Then, respective gas ports 31a (FIG. 5) of the second gas supplying parts 31 are directed in a diagonal direction that is a direction inclined with respect to the probes 10. Thus, diagonally spraying the gas to the probes 10 removes the foreign substance from the probes 10.

When the sidewall part 7 is in contact with the chuck stage 3, the second gas supplying parts 31 can supply the gas to the measurement space 35 (FIG. 3) similarly as the first gas supplying parts 30.

A gas supply source 22 in FIG. 1 supplies the first gas supplying parts 30 and the second gas supplying parts 31 with the gas through a gas passage 36. An adjuster 29 adjusts an amount of gas to be supplied and the supply time, and the evaluation controller 4 controls the adjustment by the adjuster 29. Examples of the gas include, but not limited to, argon, nitrogen, and air. When compressed air installed in the evaluation room is used as the gas, a regulator may be provided to adjust the pressure.

The evaluation controller 4 in FIG. 1 is implemented as a function of, for example, a central processing unit (CPU) that executes a program stored in a storage such as a semiconductor memory, where the CPU and the semiconductor memory herein are not illustrated but included in the evaluation apparatus 1. The evaluation controller 4 has centralized control over the constituent elements of the evaluation apparatus 1. The evaluation controller 4 can evaluate the electrical characteristics of the semiconductor device 5 that is connected to the probes 10, for example, with the pressure increased in the measurement space 35 through supplying the gas by the first gas supplying parts 30, that is, with the partial discharge prevented.

[Operations]

Next, operations of the evaluation apparatus 1 according to Preferred Embodiment 1 will be described. When a plurality of the probes 10 are used as according to Preferred Embodiment 1, degrees of parallelism of the contact parts 11 of the probes 10 are made uniform before the evaluation. After the semiconductor device 5 is fixed to the chuck stage 3, the first gas supplying parts 30 and the sidewall part 7 come in proximity to the semiconductor device 5 and the chuck stage 3, respectively. Then, the gas is sprayed.

First, the second gas supplying parts 31 perform a first gas supplying process of spraying the gas to the probes 10 as spraying of the gas according to Preferred Embodiment 1. Then, the first gas supplying parts 30 perform a second gas supplying process of spraying the gas to the semiconductor device 5. Accordingly, after the foreign substance removed from the probes 10 falls, both the fallen foreign substance and the foreign substance originally present on the semiconductor device 5 can be removed. The first gas supplying process and the second gas supplying process may be simultaneously performed when reducing time is a high priority.

After the second gas supplying process, the flat surface 23 of the sidewall part 7 is pressed against the chuck stage 3 after a time lag or simultaneously with the contact of the electrode pad 18 of the semiconductor device 5 with the probes 10. The lower ends of the probes 10 are disposed as high as or lower than the lower end of the sidewall part 7 to reliably bring the probes 10 in contact with the electrode pad 18.

Then, at least the first gas supplying parts 30 or the second gas supplying parts 31 perform a third gas supplying process of supplying gas to the measurement space 35 to increase the pressure in the measurement space 35. The value of applied pressure that depends on a temperature to be evaluated or a voltage to be applied is, for example, higher than or equal to 20 kPa. After the pressure is adjusted to a desired value, the evaluation controller 4 starts evaluating the electrical characteristics of the semiconductor device 5 while checking the temperature of the semiconductor device 5 using the temperature sensor 37. The evaluation with the pressure applied effectively prevents the partial discharge. After evaluation on desired electrical characteristics, the pressure in the measurement space 35 is returned to the initial state using a leak valve that is not illustrated, and the sidewall part 7 and the probes 10 are separated from the surface of the chuck stage 3 and the surface of the semiconductor device 5, respectively. The pressure in the measurement space 35 may be returned to the initial state with the sidewall part 7 separated therefrom, without using the leak valve. Then, the semiconductor device 5 placed on the chuck stage 3 is replaced with the semiconductor device 5 to be evaluated next.

[Conclusion of Preferred Embodiment 1]

The evaluation apparatus 1 according to Preferred Embodiment 1 includes the first gas supplying part 30 capable of supplying a gas to the semiconductor device 5 placed on the chuck stage 3 when the sidewall part 7 comes in proximity to the chuck stage 3, and to the measurement space 35 when the sidewall part 7 is in contact with the chuck stage 3. Accordingly, not only application of the pressure to the measurement space 35 can prevent occurrence of the partial discharge but also spraying gas to the semiconductor device 5 before the measurement space 35 is formed can remove a foreign substance on the semiconductor device 5. Consequently, the occurrence of the partial discharge can be further prevented. Furthermore, since the typical structure of the evaluation apparatus 1 does not have to be significantly changed in design, reduction in cost of the evaluation apparatus 1 can be expected.

The evaluation apparatus 1 further includes the second gas supplying part 31 capable of supplying the gas to the probe 10 when the sidewall part 7 comes in proximity to the chuck stage 3, and to the measurement space 35 when the sidewall part 7 is in contact with the chuck stage 3. Consequently, since it is possible to apply pressure to the measurement space 35 and spray gas to the probe 10 before the measurement space 35 is formed, the occurrence of the partial discharge can be further prevented. The second gas supplying part 31 is not essential in Preferred Embodiment 1.

Furthermore, the first gas supplying part 30 and the second gas supplying part 31 are disposed in a portion enclosed by the sidewall part 7, the portion being included in the undersurface of the mounting plate 16 according to Preferred Embodiment 1. Since such a structure can prevent the gas sprayed before the measurement space 35 is formed from laterally escaping from the sidewall part 7, the use efficiency of the gas can be increased.

[Preferred Embodiment 2]

Figure 8:
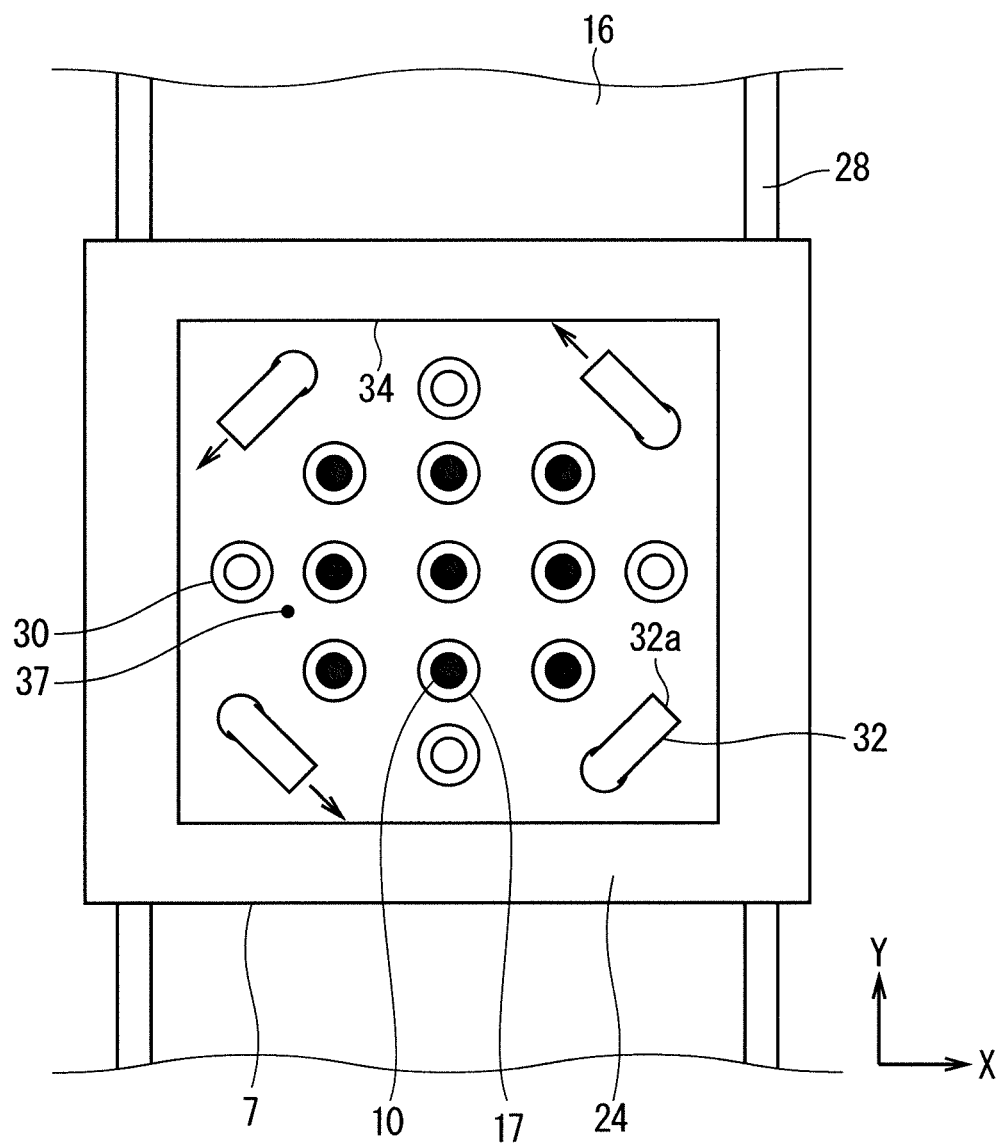
FIG. 8 is a schematic plan view illustrating a part of the structure of the evaluation apparatus according to Preferred Embodiment 1.

FIG. 8 is a schematic plan view illustrating a part of a structure of the evaluation apparatus 1 including the probe base 2 and the chuck stage 3 according to Preferred Embodiment 2 of the present invention. In the following description, the same reference numerals will be assigned to the same or similar constituent elements of Preferred Embodiment 1, and different constituent elements will be mainly described.

The evaluation apparatus 1 (FIG. 4) according to Preferred Embodiment 1 includes the second gas supplying parts 31. In contrast, the evaluation apparatus 1 according to Preferred Embodiment 2 includes third gas supplying parts 32 instead of the second gas supplying parts 31, as illustrated in FIG. 8.

The third gas supplying parts 32 can supply gas toward the sidewall part 7 when the sidewall part 7 comes in proximity to the chuck stage 3. Accordingly, the third gas supplying parts 32 can spray the gas to the sidewall part 7 before the sidewall part 7 is in contact with the chuck stage 3. Consequently, a foreign substance adhered to the sidewall part 7 can be blown off and removed before the semiconductor device 5 is evaluated.

As illustrated in FIG. 8, in the portion enclosed by the sidewall part 7 and included in the undersurface of the mounting plate 16, four of the third gas supplying parts 32 are disposed according to Preferred Embodiment 2. Then, respective gas ports 32a of the third gas supplying parts 32 are directed in a diagonal direction with respect to an inner wall surface 34 that is a wall surface inside the sidewall part 7. Accordingly, a foreign substance is removed from the sidewall part 7 with the gas diagonally sprayed. The gas ports 32a of the third gas supplying parts 32 are directed in a ring-shaped direction in a plan view when the mounting plate 16 is viewed from the lower surface. Since such a structure involves rotating gas flows, improvement in the effect of removing a foreign substance can be expected.

When the sidewall part 7 is in contact with the chuck stage 3, the third gas supplying parts 32 can supply the gas to the measurement space 35 similarly as the first gas supplying parts 30.

[Operations]

Operations of the evaluation apparatus 1 according to Preferred Embodiment 2 are the same as those described in Preferred Embodiment 1 except for the first and third gas supplying processes. Although the second gas supplying parts 31 spray the gas to the probes 10 in the first gas supplying process according to Preferred Embodiment 1, the third gas supplying parts 32 spray the gas to the sidewall part 7 in the first gas supplying process according to Preferred Embodiment 2. In the third gas supplying process according to Preferred Embodiment 2, at least the first gas supplying parts 30 or the third gas supplying parts 32 supply gas to the measurement space 35.

[Conclusion of Preferred Embodiment 2]

The evaluation apparatus 1 according to Preferred Embodiment 2 includes the third gas supplying part 32 capable of supplying the gas to the sidewall part 7 when the sidewall part 7 comes in proximity to the chuck stage 3, and to the measurement space 35 when the sidewall part 7 is in contact with the chuck stage 3. Consequently, since it is possible to apply pressure to the measurement space 35 and spray gas to the sidewall part 7 before the measurement space 35 is formed, the occurrence of the partial discharge can be further prevented.

Furthermore, the first gas supplying part 30 and the third gas supplying part 32 are disposed in a portion enclosed by the sidewall part 7, the portion being included in the undersurface of the mounting plate 16 according to Preferred Embodiment 2. Since such a structure can prevent the gas sprayed before the measurement space 35 is formed from laterally escaping from the sidewall part 7, the use efficiency of the gas can be increased.

The gas port 32a of the third gas supplying part 32 is, but not limited to, directed in a diagonal direction with respect to the inner wall surface 34 of the sidewall part 7. The gas port of the third gas supplying part 32 may be directed in a vertical direction with respect to the inner wall surface 34 of the sidewall part 7, which is not illustrated. Such a structure can directly remove a foreign substance using gas.

In another example, the gas ports of the third gas supplying parts 32 may be combined, which is not illustrated. In other words, some gas ports of the third gas supplying parts 32 may be directed in the vertical direction with respect to the inner wall surface 34 of the sidewall part 7, and the rest of the gas ports of the third gas supplying parts 32 may be directed in the diagonal direction with respect to the inner wall surface 34 of the sidewall part 7.

[Modification 1]

The evaluation apparatus 1 described in each of Preferred Embodiments 1 and 2 includes, but not limited to, the second gas supplying parts 31 or the third gas supplying parts 32. The evaluation apparatus 1 according to Modification 1 that is not illustrated may include, for example, both the second gas supplying parts 31 and the third gas supplying parts 32. Such a structure can produce the advantages of both Preferred Embodiments 1 and 2.

According to Modification 1 and others, at least the first gas supplying parts 30 or the second gas supplying parts 31 may be disposed on the inner wall surface 34 of the sidewall part 7. FIG. 9 is a schematic cross view illustrating an example structure in which the four first gas supplying parts 30 are disposed on the respective four sides of the inner wall surface 34 (FIG. 8) of the sidewall part 7. Since such as structure eliminates the need for a process of attaching gas supplying parts to the mounting plate 16, the constituent elements disposed on the mounting plate 16 can be reduced.

Figure 10:
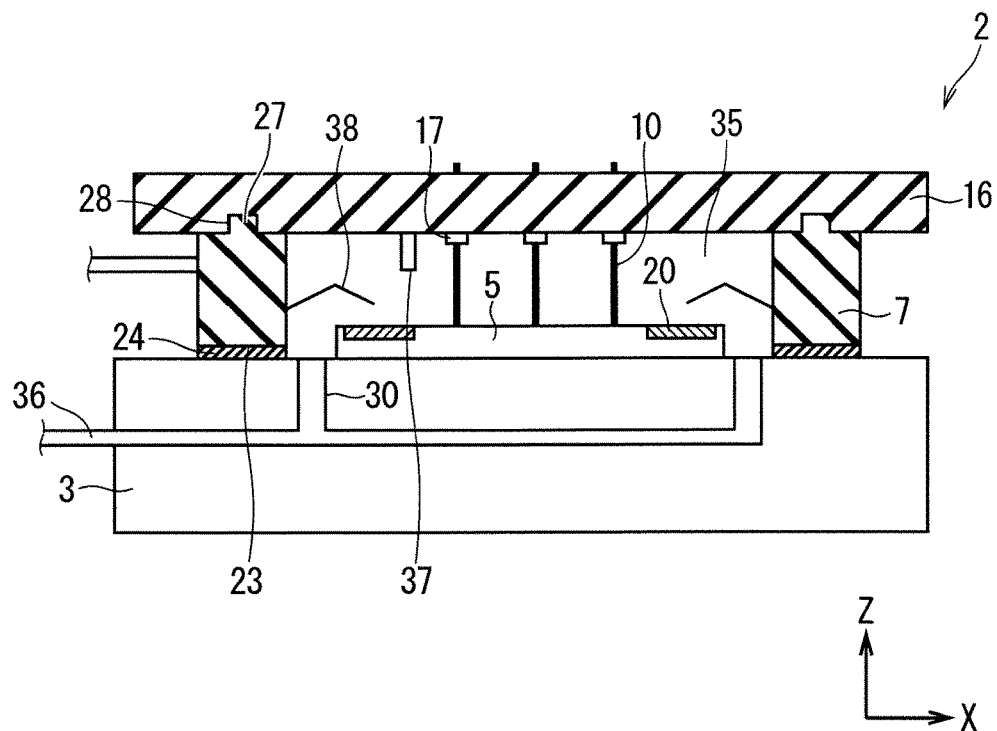
FIG. 10 is a schematic cross view illustrating a part of the structure of the evaluation apparatus according to Modification 1.

Furthermore, according to Modification 1 and others, at least the first gas supplying part 30, the second gas supplying part 31, or the third gas supplying part 32 may be disposed in a first portion inner than a second portion that can be in contact with the sidewall part 7, the first portion being included in an upper portion of the chuck stage 3. FIG. 10 is a schematic cross view illustrating an example structure in which the four first gas supplying parts 30 are placed in the upper portion of the chuck stage 3. Such a structure can facilitate handling of piping to the gas passage 36 and replacement of the sidewall part 7 and the probe base 2.

The inner wall surface 34 of the sidewall part 7 may have a gas-direction variable mechanism that allows a direction in which gas is jetted from at least the first gas supplying parts 30, the second gas supplying parts 31, or the third gas supplying parts 32 to be changed in a direction of the semiconductor device 5. FIG. 10 illustrates, as one of the examples, a gas-direction variable mechanism 38 that allows a direction in which gas is jetted from the first gas supplying parts 30 to be changed in the direction of the semiconductor device 5. Such a structure allows the gas to be effectively sprayed to the semiconductor device 5 while preventing the first gas supplying parts 30 from protruding from the surface of the chuck stage 3. The gas-direction variable mechanism 38 is made of a resin or an insulating material, and is installed on the sidewall part 7 through, for example, screwing or applying an adhesive.

[Modification 2]

The gas ports 30a of the first gas supplying parts 30 illustrated in, for example, FIG. 3 are, but not limited to, directed in the vertical direction with respect to the upper surface of the semiconductor device 5, from above the edge termination area 20 of the semiconductor device 5.

The gas ports 30a of the first gas supplying parts 30 may be, for example, directed in a diagonal direction with respect to the upper surface of the chuck stage 3, specifically, the upper surface of the semiconductor device 5. Such a structure allows the gas diagonally sprayed to remove a foreign substance through laterally pushing out the foreign substance. Such a structure may be achieved by folding the vicinity of the gas ports 30a of the first gas supplying parts 30 similarly as the second gas supplying part 31 in FIG. 5, or by diagonally placing the first gas supplying part 30 with respect to the mounting plate 16 as illustrated in the schematic cross view of FIG. 11.

In such a structure, the gas ports 30a of the first gas supplying parts 30 may be directed in a ring-shaped direction in a plan view when the mounting plate 16 is viewed from the lower surface as the third gas supplying parts 32 illustrated in FIG. 8. Since such a structure involves rotating gas flows, improvement in the effect of removing a foreign substance can be expected.

Figure 12:
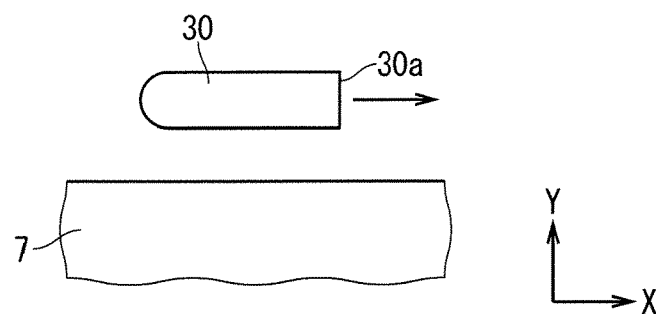
FIG. 12 is a schematic plan view illustrating a part of the structure of the evaluation apparatus according to Modification 2.

The gas ports 30a of the first gas supplying parts 30 may be directed along the inner wall surface 34 of the sidewall part 7, specifically, the edge termination area 20 (FIG. 2) of the semiconductor device 5 as illustrated in the schematic plan view of FIG. 12 to mainly remove a foreign substance on the edge termination area 20. The gas ports 30a of the first gas supplying parts 30 may be directed in a diagonal direction with respect to the inner wall surface 34 of the sidewall part 7, specifically, the edge termination area 20 of the semiconductor device 5 as illustrated in the schematic plan view of FIG. 13, if a foreign substance on the edge termination area 20 is not mainly removed.

Figure 11:
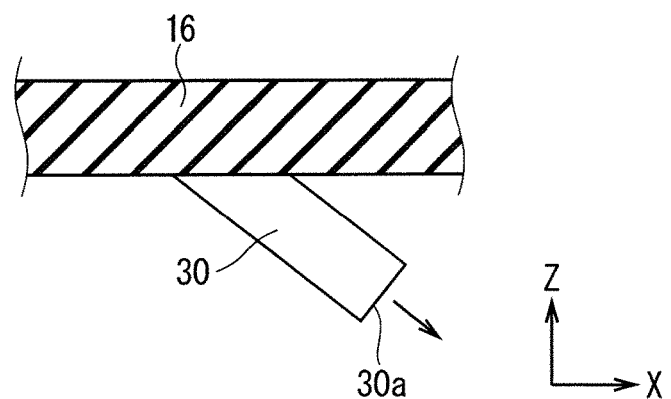
FIG. 11 is a schematic cross view illustrating a part of a structure of an evaluation apparatus according to Modification 2.
Figure 13:
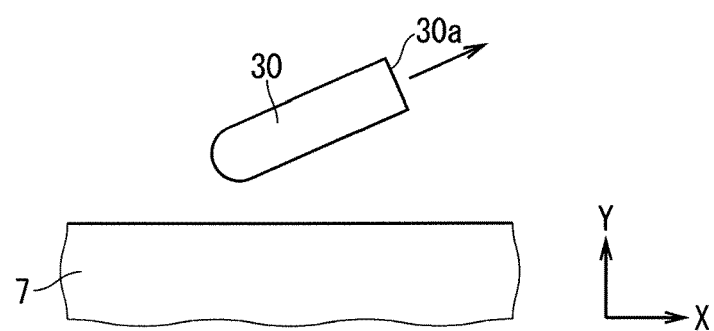
FIG. 13 is a schematic plan view illustrating a part of the structure of the evaluation apparatus according to Modification 2.

Furthermore, the structure in FIG. 3 may be combined with the structure in at least one of, for example, FIGS. 11 to 13 as an example structure of the gas ports of the first gas supplying parts 30. In other words, some of the gas ports of a plurality of the first gas supplying parts 30 may be directed in the vertical direction with respect to the upper surface of the chuck stage 3, and the rest of the gas ports of the first gas supplying parts 30 may be directed in the diagonal direction with respect to the upper surface of the chuck stage 3.

Figure 14:
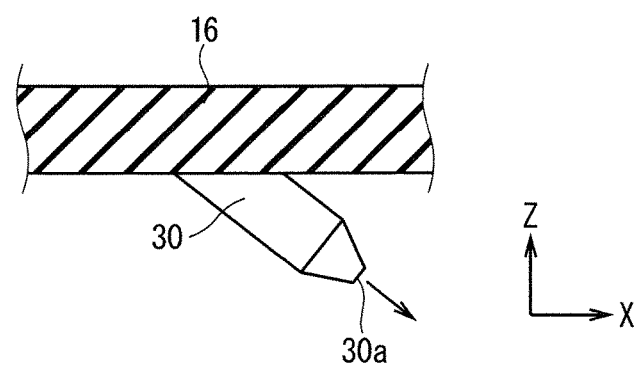
FIG. 14 is a schematic cross view illustrating a part of the structure of the evaluation apparatus according to Modification 2.

Furthermore, at least the first gas supplying parts 30, the second gas supplying parts 31, or the third gas supplying parts 32 may have gas ports with a tapered shape such as a narrowing structure. FIG. 14 is a schematic cross view illustrating an example structure in which the gas port 30*a* of the first gas supplying part 30 has a tapered shape. Although such a structure narrows a gas spraying area, the gas can be more intensely sprayed.

Preferred Embodiments and Modifications of the present invention can be free combined, and appropriately modified and omitted within its scope.

While the invention has been shown and described in detail, the foregoing description is in all aspects illustrative and not restrictive. It is therefore understood that numerous modifications and variations can be devised without departing from the scope of the invention.

What is claimed is:

1. An evaluation apparatus that evaluates electrical characteristics of an object subject to measurement that is a to-be-measured object, comprising:
    a stage on which said to-be-measured object is placed; and
    an upper component disposed above said stage,
    wherein said stage and said upper component can come in proximity to and be separated from each other,
    said evaluation apparatus, further comprising:
    a probe disposed on an undersurface of said upper component;
    a sidewall part disposed on said undersurface of said upper component and enclosing sides of said probe;
    a first gas supplying part capable of supplying a gas, wherein
        when said sidewall part is in proximity to said stage and before said sidewall part is in contact with said stage, said first gas supplying part is configured to supply said gas to said to-be-measured object placed on said stage, and
        when said sidewall part is in contact with said stage, said first gas supplying part is configured to supply said gas to a space enclosed by said stage, said sidewall part, and said upper component; and
    an evaluator that evaluates said electrical characteristics of said to-be-measured object connected to said probe, with a pressure increased in said space through supplying said gas from said first gas supplying part.

2. The evaluation apparatus according to claim 1, further comprising
    a second gas supplying part having a gas port that faces said probe, wherein
    the second gas supplying part is configured to supply said gas directly to said probe when said sidewall part is in proximity to said stage, and to said space when said sidewall part is in contact with said stage.

3. The evaluation apparatus according to claim 1, further comprising
    a third gas supplying part having a gas port that faces an inner wall surface of said sidewall part, wherein
    the third gas supplying part is configured to supply said gas directly to said inner wall surface of said sidewall part when said sidewall part is in proximity to said stage, and to said space when said sidewall part is in contact with said stage.

4. The evaluation apparatus according to claim 1, further comprising:
    a second gas supplying part capable of supplying a gas to said probe when said sidewall part comes in proximity to said stage, and to said space when said sidewall part is in contact with said stage; and
    a third gas supplying part capable of supplying a gas to said sidewall part when said sidewall part comes in proximity to said stage, and to said space when said sidewall part is in contact with said stage.

5. The evaluation apparatus according to claim 4,
    wherein at least one of said first gas supplying part, said second gas supplying part, and said third gas supplying part is disposed in a portion enclosed by said sidewall part, the portion being included in said undersurface of said upper component.

6. The evaluation apparatus according to claim 2,
    wherein at least one of said first gas supplying part and said second gas supplying part is disposed on an inner wall surface of said sidewall part.

7. The evaluation apparatus according to claim 4,
    wherein at least one of said first gas supplying part, said second gas supplying part, and said third gas supplying part is disposed in a first portion inner than a second portion that can be in contact with said sidewall part, said first portion being included in an upper portion of said stage.

8. The evaluation apparatus according to claim 1,
    wherein said first gas supplying part includes a gas port directed in a vertical direction with respect to an upper surface of said stage.

9. The evaluation apparatus according to claim 1,
    wherein said first gas supplying part includes a gas port directed in a diagonal direction with respect to an upper surface of said stage.

10. The evaluation apparatus according to claim 9,
    wherein a plurality of said first gas supplying parts include a gas port directed in a ring-shaped direction in a plan view of said upper component.

11. The evaluation apparatus according to claim 1,
    wherein a plurality of said first gas supplying parts include a gas port directed in a vertical direction with respect to an upper surface of said stage, and
    said plurality of said first gas supplying parts include a gas port directed in a diagonal direction with respect to said upper surface of said stage.

12. The evaluation apparatus according to claim 3,
    wherein said third gas supplying part includes a gas port directed in a vertical direction with respect to said inner wall surface of said sidewall part.

13. The evaluation apparatus according to claim 3,
    wherein said third gas supplying part includes a gas port directed in a diagonal direction with respect to said inner wall surface of said sidewall part.

14. The evaluation apparatus according to claim 3,
    wherein a plurality of said third gas supplying parts include a gas port directed in a vertical direction with respect to said inner wall surface of said sidewall part, and
    said plurality of said third gas supplying parts include a gas port directed in a diagonal direction with respect to said inner wall surface of said sidewall part.

15. The evaluation apparatus according to claim 4,
    wherein at least one of said first gas supplying part, said second gas supplying part, and said third gas supplying part has a tapered gas port.

16. The evaluation apparatus according to claim 1, further comprising
   an elastic body disposed on said sidewall part or said stage,
   wherein said sidewall part can be in contact with said stage through said elastic body.

17. The evaluation apparatus according to claim 1,
   wherein said sidewall part includes a flexible protective material disposed at a portion that can be in contact with said stage.

18. The evaluation apparatus according to claim 4, further comprising
   a variable mechanism disposed on said sidewall part, said variable mechanism allowing a direction in which said gas is jetted from at least one of said first gas supplying part, said second gas supplying part, and said third gas supplying part to be changed in a direction of said to-be-measured object disposed on said stage.

19. The evaluation apparatus according to claim 1, further comprising
   a temperature measuring part that measures a temperature of said to-be-measured object disposed on said stage.

20. An evaluation method to be performed by an evaluation apparatus that evaluates electrical characteristics of an object subject to measurement that is a to-be-measured object, the evaluation apparatus performing the method comprising:
   a stage on which said to-be-measured object is placed;
   an upper component disposed above said stage, wherein said stage and said upper component can come in proximity to and be separated from each other;
   a probe disposed on an undersurface of said upper component
   a sidewall part disposed on said undersurface of said upper component and enclosing sides of said probe;
   a first gas supplying part capable of supplying a gas, wherein when said sidewall part is in proximity to said stage and before said sidewall part is in contact with said stage, said first gas supplying part is configured to supply said gas to said to-be-measured object placed on said stage, and when said sidewall part is in contact with said stage, said first gas supplying part is configured to supply said gas to a space enclosed by said stage, said sidewall part, and said upper component;
   an evaluator that evaluates said electrical characteristics of said to-be-measured object connected to said probe, with a pressure increased in said space through supplying said gas from said first gas supplying part;
   a second gas supplying part capable of supplying a gas to said probe when said sidewall part comes in proximity to said stage, and to said space when said sidewall part is in contact with said stage; and
   a third gas supplying part capable of supplying a gas to said sidewall part when said sidewall part comes in proximity to said stage, and to said space when said sidewall part is in contact with said stage;
   said method comprising:
   a first gas supplying process of supplying a gas from at least one of said second gas supplying part and said third gas supplying part when said sidewall part comes in proximity to said stage;
   a second gas supplying process of supplying a gas from said first gas supplying part before said sidewall part is in contact with said stage, said second gas supplying process being performed after said first gas supplying process; and
   a third gas supplying process of supplying a gas from at least one of said first gas supplying part, said second gas supplying part, and said third gas supplying part to said space when said sidewall part is in contact with said stage.

* * * * *